(12) United States Patent
Weber

(10) Patent No.: US 6,237,119 B1
(45) Date of Patent: May 22, 2001

(54) METHOD AND SYSTEM FOR MAKING INTERNAL STATES OF AN INTEGRATED CIRCUIT VISIBLE DURING NORMAL OPERATION WITHOUT THE USE OF DEDICATED I/O PINS

(75) Inventor: Matthew David Weber, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/243,957

(22) Filed: Feb. 3, 1999

(51) Int. Cl.[7] .................................................. G06F 11/00
(52) U.S. Cl. ........................................ 714/724; 714/744
(58) Field of Search ..................................... 714/724, 744

(56) References Cited

U.S. PATENT DOCUMENTS 5,361,249 * 11/1994 Monastra et al. .................... 370/217
6,157,206 * 12/2000 Taylor et al. ........................... 326/30

* cited by examiner

Primary Examiner—Phung M. Chung
(74) Attorney, Agent, or Firm—Bracewell & Patterson L.L.P.

(57) ABSTRACT

A system includes a first integrated circuit and a second integrated circuit coupled by at least one signal line. The first integrated circuit outputs on the signal line an interleaved output signal including both operating data and debug data. The second integrated circuit receives as an input signal, of the operating data and the debug data, only the operating data. In this manner, the internal states of the first integrated circuit are made visible during normal operation of the system without the use of dedicated I/O pins.

22 Claims, 3 Drawing Sheets

METHOD AND SYSTEM FOR MAKING INTERNAL STATES OF AN INTEGRATED CIRCUIT VISIBLE DURING NORMAL OPERATION WITHOUT THE USE OF DEDICATED I/O PINS

BACKGROUND OF THE INVENTION

1. Technical Field

The present invention relates in general to electronic devices and, in particular, to communication between electronic devices. Still more particularly, the present invention relates to a method and system for communicating input/output (I/O) signals via address lines of an interconnect linking electronic devices.

2. Description of the Related Art

Debugging a highly integrated, complex integrated circuit (e.g., an Applicant Specific Integrated Circuits (ASICs)) is difficult due to the limited visibility of the internal states of the integrated circuit. In order to make such internal states available for external observation, many conventional integrated circuits are equipped with dedicated debug I/O pins on which the states of selected internal testpoints are made visible. However, increasing the number of I/O pins can dramatically increase the overall cost of the integrated circuit. The present invention therefore recognizes that it would be desirable and useful to make the internal testpoint states of an integrated circuit available for external observation without the addition of dedicated debug I/O pins.

SUMMARY OF THE INVENTION

A system includes a first integrated circuit and a second integrated circuit coupled by an interconnect including at least one signal line. The first integrated circuit outputs on the signal line an interleaved output signal including both operating data and debug data. The second integrated circuit receives as an input signal, of the operating data and the debug data, only the operating data. In this manner, the internal states of the first integrated circuit are made visible during normal operation of the system without the use of dedicated I/O pins.

All objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF ILLUSTRATIVE EMBODIMENT

Figure 1:
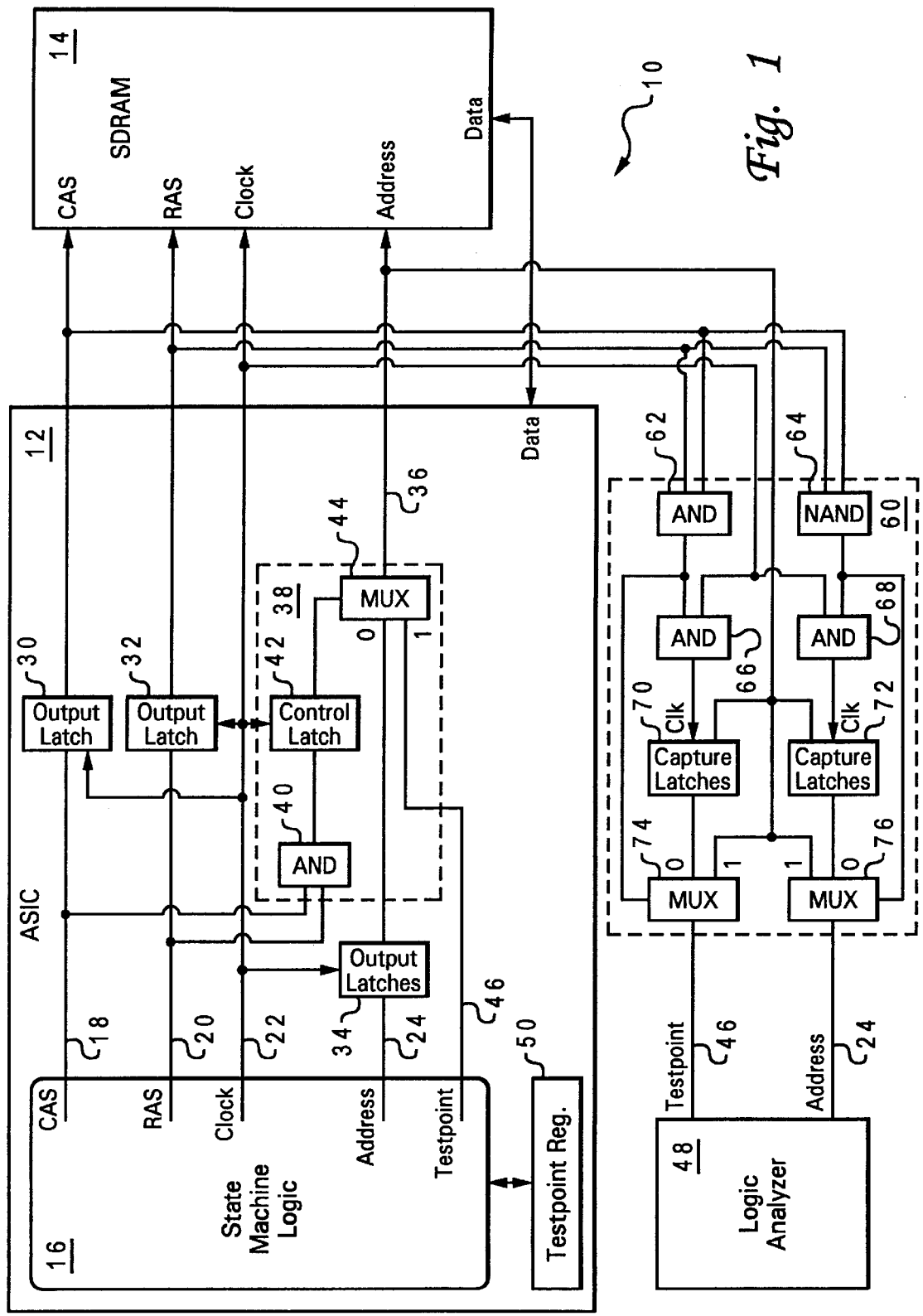
FIG. 1 depicts an illustrative embodiment of a system including an integrated circuit that outputs an interleaved output signal including both operating data and debug data, in accordance with the present invention.

With reference now to the figures and in particular with reference to FIG. 1, there is depicted an illustrative embodiment of a system in accordance with the present invention. As illustrated, system 10 includes a first integrated circuit, such as ASIC 12, and a second integrated circuit, such as Synchronous Dynamic Random Access Memory (SDRAM) 14. ASIC 12 includes a plurality of state machines, collectively designated as state machine logic 16. These state machines, which each have a plurality of possible states, change states and generate output signals in response to input signals and/or the respective current states of the constituent state machines.

In the depicted embodiment of system 10, ASIC 12 serves as a memory controller for SDRAM 14. Accordingly, the output signals of state machine logic 16 include Column Address Strobe (CAS) signal 18, Row Address Strobe (RAS) signal 20, clock signal 22, and an address signal 24, which may include one or more parallel address bits. When active, CAS signal 18 and RAS signal 20 indicate that address signal 24 represents a column address and a row address, respectively. Clock signal 22 synchronizes the sourcing of output signals by ASIC 12 and the sampling of those output signals by SDRAM 14. In particular, clock signal 22 controls the operation of output latches 30, 32, and 34 so they output CAS signal 18, RAS signal 20, and clock signal 22, respectively, on selected edges of clock signal 22. SDRAM 14 samples the signal present at its address input only during clock cycles in which one of CAS signal 18 and RAS signal 20 is active.

As discussed above, for debug purposes it is desirable to have access to the internal states of state machine logic 16, but it is preferable from a cost standpoint not to implement dedicated I/O pins to make such internal states available for external monitoring. The present invention solves the problem of providing visibility for the internal states of ASIC 12 without utilizing dedicated debug pins by interleaving indications of an internal state (hereafter called testpoint or debug data) of state machine logic 16 with the row and column addresses of address signal 24 to form an interleaved output signal 36. As indicated in the illustrative embodiment of FIG. 1, interleaved output signal 36 can be produced by selection logic 38, which includes AND gate 40, control latch 42, and a two-input multiplexer (mux) 44. Multiplexer 44 has a first input coupled to the output of output latches 34 and a second input coupled to testpoint signal 46. In response to the select signal generated by AND gate 40 and gated by control latch 42, multiplexer 44 outputs the address signal 24 received from output latches 34 during cycles of clock signal 22 in which either CAS or RAS is active (i.e., logic low) and, conversely, outputs testpoint signal 46 during cycles in which both CAS and RAS are inactive (i.e., logic high). Because SDRAM 14 samples interleaved output signal 36 only when either CAS signal 18 or RAS signal 20 is active, the internal states of state machine logic 16 within interleaved output signal 36 can be monitored by a logic analyzer 48 while SDRAM 14 (and ASIC 12) remains in its normal operating mode.

While it is possible to hardwire which internal state machine has its current state output as testpoint signal 46, the selected state machine (or state machines) for which the current state is made visible is preferably determined by one or more hardware and/or softwareprogrammable testpoint registers 50. Each testpoint register 50 contains a plurality of bits that form an encoded indication of a particular testpoint (i.e., state machine).

While the testpoint data contained within interleaved output signal 36 can be analyzed by logic analyzer 48 without further processing, analysis of the testpoint data is simplified by the use of a signal decoder 60 that receives interleaved output signal 36 as an input and separately outputs address signal 24 and testpoint signal 46. In the illustrative embodiment, signal decoder 60 includes AND gates 62, 66, and 68, NAND gate 64, capture latches 70 and 72, and multiplexers 74 and 76. AND gate 62 and NAND gate 64 each receive CAS signal 18 and RAS signal 20 as inputs. If both CAS signal 18 and RAS signal 20 are inactive (i.e., logic high), AND gate 62 outputs a logic high signal that forms a first input of AND gate 66, and NAND gate 64 outputs a logic low signal that forms a first input of AND gate 68. Conversely, if both CAS signal 18 and RAS signal 20 are active (i.e., logic low), AND gate 62 outputs a logic low signal that forms a first input of AND gate 66, and NAND gate 64 outputs a logic high signal that forms a first input of AND gate 68. If only one of CAS and RAS signals 18 and 20 is active, both AND gate 62 and NAND gate 64 output logic low signals.

The first input signals received by AND gates 66 and 68 are qualified by clock signal 22, so that capture latches 70 and 72 latch interleaved output signal 36 when the output from the respective one of AND gates 66 and 68 is logic high. If the output of the respective one of AND gates 66 and 68 is logic low, capture latches 70 and 72 retain their previous value. Multiplexers 74 and 76, which each receive interleaved output signal 36 and the output of the associated one of capture latches 70 and 72 as data inputs, then select between their data inputs in response to the output of the associated one of AND gate 62 and NAND gate 64. In this manner, multiplexer 74 reproduces testpoint signal 46, and multiplexer 76 reproduces address signal 24, which signals form separate inputs of logic analyzer 48.

Figure 2:
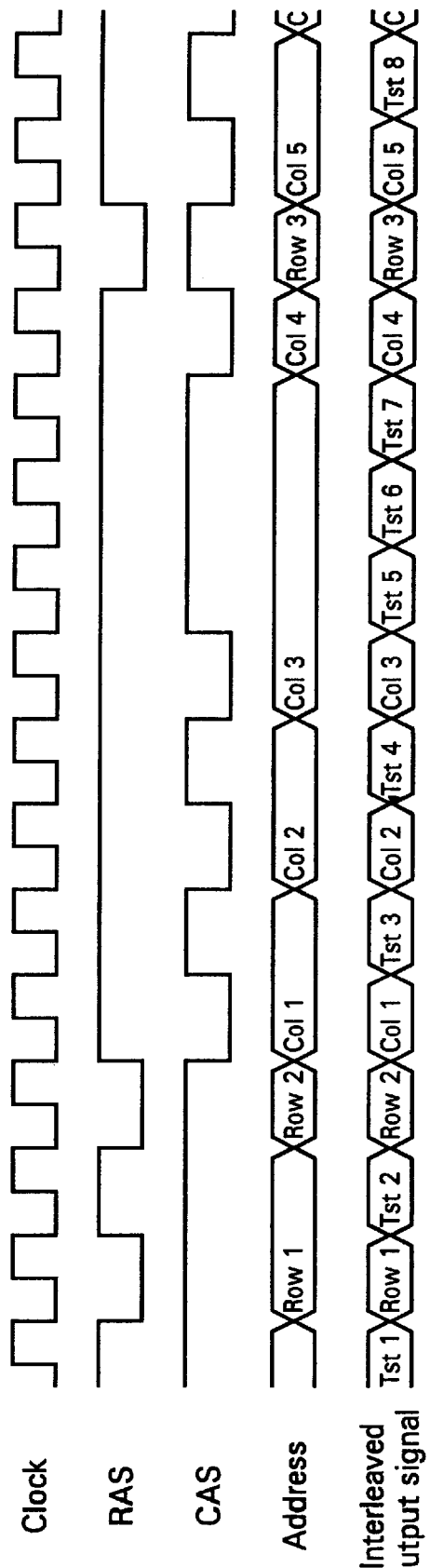
FIG. 2 is a timing diagram illustrating the timing of the signals shown in FIG. 1.

Referring now to FIG. 2, an exemplary timing diagram of the operation of system 10 is illustrated. As shown, clock signal 22 periodically alternates between logic high and logic low states, with all other signals making transitions on the falling edge of clock signal 22. As further shown in FIG. 2, state machine logic 16 outputs a row address within address signal 24 when RAS signal 20 is asserted (i.e., transitions from logic high to logic low) and so long thereafter until CAS signal 18 is asserted. Similarly, state machine logic 16 outputs a column address within address signal 24 when CAS signal 18 is asserted and so long thereafter until RAS signal 20 is asserted. Because row and column addresses are each sampled by SDRAM 14 only during the first cycle that they are presented, selection logic 38 is able to interleave testpoint data between address cycles, thus forming interleaved output signal 36.

Figure 3:
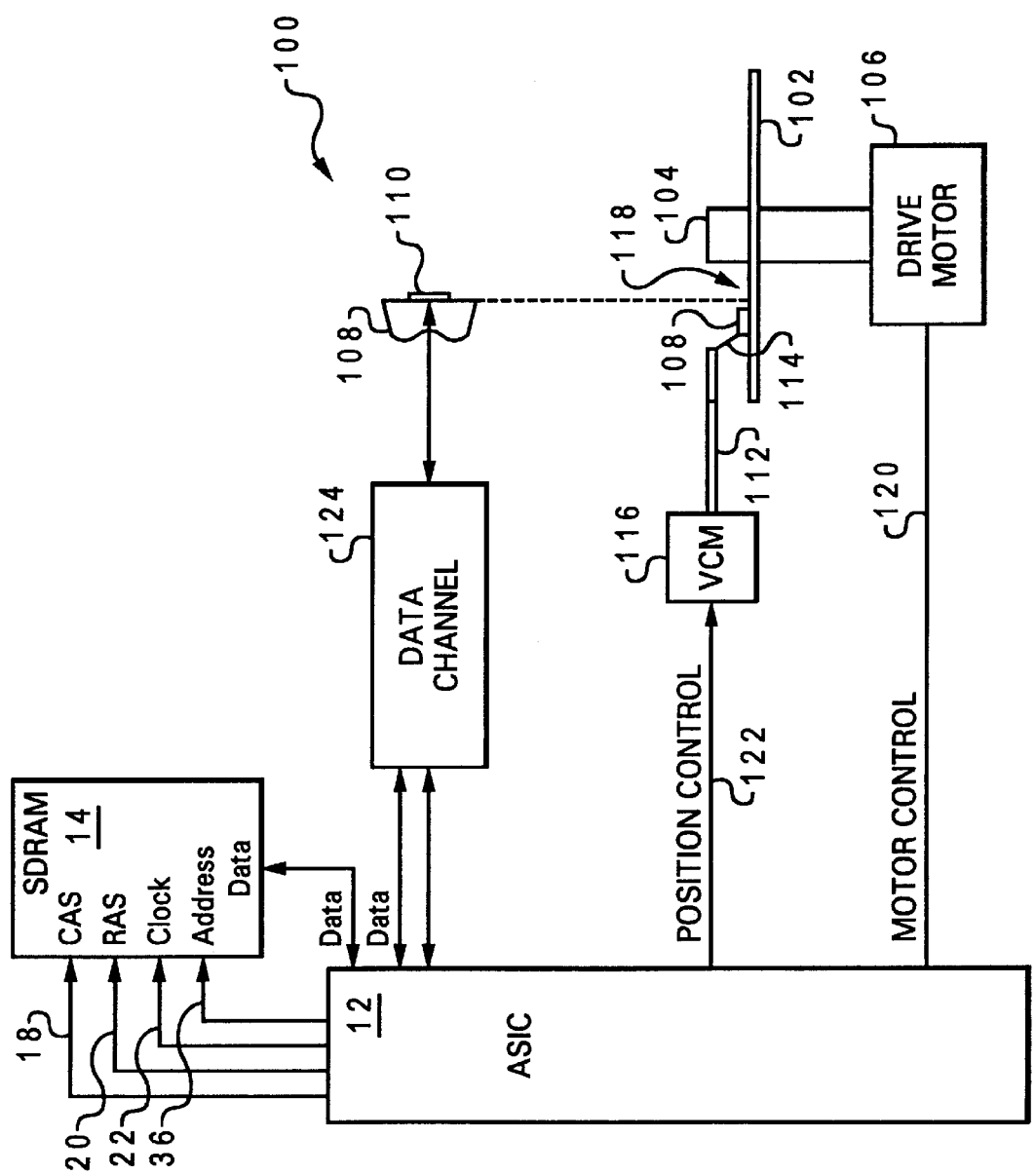
FIG. 3 depicts a data storage system in accordance with the present invention.

It should be understood that system 10 described above is merely illustrative of the principles of the present invention and that the present invention is applicable to any system of integrated or discrete electronic circuits. Thus, in other embodiments of the present invention, the operating data with which the testpoint data is interleaved may comprise other types of data than address data. However, in order to provide a better understanding of the operation and advantages of the present invention, a conceptual diagram of a data storage system incorporating system 10 of FIG. 1 is depicted in FIG. 3. Although data storage system shown in FIG. 3 is a magnetic disk storage system, it will be apparent that the invention is also applicable to other data storage systems such as an optical disk or magnetic tape storage systems, for example.

Referring now to FIG. 3, data storage system 100 includes a housing (not illustrated) containing at least one rotatable magnetic disk 102 supported on a spindle 104 and rotated by a drive motor 106. Each magnetic disk 102 has a magnetic recording medium formed on at least one disk surface 118, where the magnetic recording medium is arranged in an annular pattern of concentric data tracks (not shown). At least one slider 108 including one or more magnetic read/write heads 110 is positioned over magnetic disk 102. Slider 108 is suspended from an actuator arm 112 by a suspension 114 (also referred to as a head gimbal assembly (HGA)). The radial position of slider 108 with respect to the tracks of magnetic disk 102 is controlled by voice coil motor (VCM) 116.

During operation of data storage system 100, the rotation of magnetic disk 102 generates an air bearing between slider 108 and disk surface 118. The air bearing thus counterbalances the slight downward-biased spring force of suspension 114 and supports slider 108 above disk surface 118 by a small, substantially constant spacing. As magnetic disk 102 is rotated by drive motor 106, slider 108 is moved radially in and out in response to the movement of actuator arm 112 by VCM 116, thus permitting magnetic read/write head 110 to read or write data of interest in different tracks. Read and write signals are communicated to and from read/write head 110 via data channel 124, which includes conductor lines running along suspension 114 and actuator arm 112. Data read from or to be written to magnetic disk 102 via data channel 124 is buffered by SDRAM 14.

The various components of data storage system 100 are controlled during operation by signals generated by ASIC 12, which serves as a data storage system controller. The control signals generated by ASIC 12 include motor control signals 120, which control the rotation of spindle 104 by drive motor 106, and head position control signals 122, which provide the desired current profiles to optimally move and position a selected slider 108 to a desired data track on the associated magnetic disk 102. In addition, ASIC 12 also outputs CAS signal 18, RAS signal 20, clock signal 22 and interleaved output signal 36, which control read and write accesses to the memory array of SDRAM 14.

As has been described, the present invention provides a system in which the internal states of a first integrated circuit within the system can be made available for monitoring during normal system operation without the use of dedicated debug I/O pins. Such internal states (or testpoint data) are interleaved with operating data (e.g., data, addresses, etc.) to form an interleaved output signal sourced by the first integrated circuit and received by a second integrated circuit. The second integrated circuit receives the operating data within the interleaved output signal as an input signal, but does not receive the testpoint data. As a result, both of the first and second integrated circuits can continue their normal operation while the testpoint data of the first integrated circuit is made visible for external monitoring and analysis.

While the invention has been particularly shown and described with reference to a preferred embodiment, it will be understood by those skilled in the art that various changes in form and detail may be made therein without departing from the spirit and scope of the invention.

What is claimed is:

1. A system in which internal states of an integrated circuit can be monitored during normal operation, said system comprising:

a first integrated circuit and a second integrated circuit coupled by at least one signal line, wherein said first integrated circuit outputs on said at least one signal line an interleaved output signal including both operating data and debug data, and wherein said second integrated circuit receives as an input signal, of said operating data and said debug data, only said operating data.

2. The system of claim 1, and further comprising a clock signal that synchronizes communication between said first and said second integrated circuits via said at least one signal line.

3. The system of claim 2, wherein said second integrated circuit comprises a synchronous memory.

4. The system of claim 1, and further comprising at least one control signal that forms an input of said second integrated circuit, wherein said interleaved output signal is synchronized with said at least one control signal, such that said interleaved output signal conveys operating data when said at least one control signal is in an active state.

5. The system of claim 4, said first integrated circuit comprising:
   an output port coupled to said at least one signal line;
   internal state machine logic having a plurality of possible states including a current state, wherein said internal state machine logic generates said operating data and said at least one control signal; and
   selection logic coupled to said internal state machine logic and to said output port, wherein said selection logic supplies said operating data to said output port if said at least one control signal is in an active state and otherwise supplies said current state to said output port as said debug data.

6. The system of claim 1, and further comprising a signal decoder coupled to said at least one signal line, wherein said decoding circuitry receives said interleaved output signal as an input and separately outputs said operating data and said debug data.

7. The system of claim 1, wherein said operating data includes an address.

8. A data storage system in which internal states of an integrated circuit can be monitored during normal operation, said data storage system comprising:
   a data storage medium;
   a data channel for reading data from said data storage medium; and
   an integrated control circuit that controls access to said data storage medium via said data channel and a second integrated circuit coupled to said integrated control circuit by at least one signal line, wherein said integrated control circuit outputs on said at least one signal line an interleaved output signal including both operating data and debug data, and wherein said second integrated circuit receives as an input signal, of said operating data and said debug data, only said operating data.

9. The data storage system of claim 8, and further comprising a clock signal that synchronizes communication between said integrated control circuit and said second integrated circuit via said at least one signal line.

10. The data storage system of claim 9, wherein said second integrated circuit comprises a synchronous memory.

11. The data storage system of claim 8, and further comprising at least one control signal forming an input of said second integrated circuit, wherein said integrated control circuit synchronizes said interleaved output signal with said at least one control signal such that said interleaved output signal conveys operating data when said at least one control signal is in an active state.

12. The data storage system of claim 11, said integrated control circuit comprising:
   an output port coupled to said at least one signal line;
   internal state machine logic having a plurality of possible states including a current state, wherein said internal state machine logic generates said operating data and said at least one control signal; and
   selection logic coupled to said internal state machine logic and to said output port, wherein said selection logic supplies said operating data to said output port if said at least one control signal is in an active state and otherwise supplies said current state to said output port as said debug data.

13. The data storage system of claim 8, and further comprising a signal decoder coupled to said at least one signal line, wherein said decoding circuitry receives said interleaved output signal as an input and separately outputs said operating data and said debug data.

14. The data storage system of claim 8, wherein said operating data includes an address.

15. The data storage system of claim 8, wherein said data storage system comprises a disk drive.

16. The data storage system of claim 8, said disk drive further comprising:
   a housing;
   a spindle on which said data storage medium is supported;
   a drive motor that rotates said spindle;
   a slider having a transducer formed therein for sensing data stored by said data storage medium; and
   a suspension that maintains said slider in closely spaced relation to said data storage medium.

17. A method of supplying the internal states of an integrated circuit within a system during its normal operation, said system including a first integrated circuit and a second integrated circuit coupled by at least one signal line, said method comprising:
   outputting from said first integrated circuit on said at least one signal line an interleaved output signal including both operating data and debug data; and
   receiving within said second integrated circuit as an input signal, of said operating data and said debug data, only said operating data.

18. The method of claim 17, and further comprising synchronizing communication between said first and said second integrated circuits via said at least one signal line utilizing a clock signal.

19. The method of claim 18, wherein said second integrated circuit comprises a synchronous memory, wherein said receiving operating data further comprises receiving an address.

20. The method of claim 17, said system including at least one control signal forming an input of said second integrated circuit, wherein outputting an interleaved output signal comprises outputting an interleaved output signal synchronized with said at least one control signal, such that said interleaved output signal conveys operating data when said at least one control signal is in an active state.

21. The method of claim 20, wherein said first integrated circuit includes an internal state machine having a plurality of possible states including a current state, said method further comprising:
   generating said operating data and said at least one control signal within said first integrated circuit; and
   outputting said operating data if said at least one control signal is in an active state and otherwise outputting said current state as said debug data.

22. The method of claim 17, and further comprising receiving said interleaved output signal as an input of a decoder and separately outputting from said decoder said data and said debug data.

* * * * *